United States Patent [19]

Watanabe et al.

[11] Patent Number: 5,226,969

[45] Date of Patent: Jul. 13, 1993

[54] METHOD FOR CLEANING SOLID SURFACE WITH A MIXTURE OF PURE WATER AND CALCIUM CARBONATE PARTICLES

[75] Inventors: Masahiro Watanabe; Mitsuyoshi Otake; Megumi Hamano, all of Yokohama; Yoshiharu Takizawa, Hitachi, all of Japan

[73] Assignee: Hitachi, Ltd., Tokyo, Japan

[21] Appl. No.: 666,027

[22] Filed: Mar. 7, 1991

[30] Foreign Application Priority Data

Mar. 7, 1990 [JP] Japan ............... 2-053573

[51] Int. Cl.⁵ .................. B08B 5/00; B08B 7/00
[52] U.S. Cl. ........................ 134/7; 134/19; 134/35; 134/105; 134/184; 134/187; 134/193; 51/317
[58] Field of Search ........ 134/7, 8, 19, 30, 34, 134/35, 37, 184, 187, 188, 193, 105; 51/7, 17, 317

[56] References Cited

U.S. PATENT DOCUMENTS

| | | | |
|---|---|---|---|
| 2,460,918 | 2/1949 | Bodine, Jr. | 51/7 |
| 2,554,701 | 5/1951 | Hackett et al. | 51/7 X |
| 3,061,422 | 10/1962 | Sato | 51/310 |
| 3,081,239 | 3/1963 | Clauss et al. | 204/227 X |
| 3,250,521 | 5/1966 | Sergent | 51/7 |
| 4,226,642 | 10/1980 | Baran | 134/10 |
| 4,581,853 | 4/1986 | Marcus | 51/7 |

FOREIGN PATENT DOCUMENTS

| | | |
|---|---|---|
| 552498 | 4/1986 | Australia . |
| 649626 | 12/1964 | Belgium . |
| 0022960 | of 0000 | European Pat. Off. . |
| 0190024 | 8/1986 | European Pat. Off. . |
| 0880630 | 6/1953 | Fed. Rep. of Germany . |
| 3048893 | 7/1982 | Fed. Rep. of Germany . |
| 385655 | 3/1965 | Switzerland . |
| 0865563 | 4/1961 | United Kingdom . |
| 0958931 | 5/1964 | United Kingdom ......... 134/7 |
| 1240229 | 7/1971 | United Kingdom . |

Primary Examiner—Theodore Morris
Assistant Examiner—Saeed T. Chaudhry
Attorney, Agent, or Firm—Antonelli, Terry, Stout & Kraus

[57] ABSTRACT

A method for cleaning a solid surface which is effective for a substance to be cleaned having a complicated structure and which uses no solvent such as CFC or the like which is harmful to the environment of the earth. A cleaning liquid is obtained by mixing insoluble particles in a liquid and brought into an eddy-flow state so that a surface to be cleaned can be uniformly cleaned.

4 Claims, 2 Drawing Sheets

METHOD FOR CLEANING SOLID SURFACE WITH A MIXTURE OF PURE WATER AND CALCIUM CARBONATE PARTICLES

BACKGROUND OF THE INVENTION

The present invention relates to an a method for cleaning a solid surface, and particularly more to a method for cleaning a part such as a metal workpiece, a printed circuit board or the like, which has a surface having a complicated shape.

In the prior art, a cleaning apparatus and method using dry ice particles is disclosed in Japanese Patent Laid-Open No. 63-266836, and an ice fine particle generating apparatus using ice fine particles is disclosed in Japanese Patent Laid-Open No. 63-283133. In these methods and apparatuses, fine particles of dry ice or ice are blown out of a nozzle and sprayed on a substance to be cleaned for removing contaminants from the surfaces of the substance.

In addition, in other prior art, chlorine-type organic solvents such as trichloroethylene and the like and 1,1,2-trichloro-1,2,2-trifluoroethane (CFC-113 in abbreviation) are generally used for cleaning the oils, greases and waxes adhering to metal workpieces, printed circuit boards and the like.

In the above-described prior art, the former method using fine particles is effective to clean a flat board such as a glass board, a Si wafer or the like. However, this method cannot uniformly clean the whole surface print circuit board on which many electronic parts are mounted, a part having a convex and concave surface or a complicated structure with holes because the motion of the dry ice used for cleaning in a constant direction causes a shadow portion on which the fine particles cannot be sprayed.

The prior art method using a chlorine-type organic solvent such as trichloroethylene or the like has a danger of contaminating underground water, and, since CFC-113 depletes the stratospheric ozone, the use thereof is severely restricted.

SUMMARY OF THE INVENTION

It is a first object of the present invention to provide a cleaning apparatus which is capable of solving the problems of prior art and uniformly cleaning the entire surface of a part having a complicated structure by changing the direction of motion of fine particles mixed in a cleaning liquid.

It is a second object of the present invention to provide a cleaning method which is capable of solving the problems of prior art and uniformly cleaning the whole surface of a part having a complicated structure by changing the direction of motion of fine particles mixed in a cleaning liquid.

It is a third object of the present invention to provide a cleaning apparatus which has a large cleaning capability when a substance to be cleaned off from a solid surface is oil, grease or wax, and which is capable of solving the problems of prior art and uniformly cleaning the entire surface of a part having a complicated structure by changing the direction of motion of fine particles mixed in a cleaning liquid.

It is a fourth object of the present invention to provides a cleaning method which has a large cleaning capability when a substance to be cleaned off from a solid surface is oil, grease or wax, and which is capable of solving the problems of prior art and uniformly cleaning the entire surface of a part having a complicated structure by changing the direction of motion of fine particles mixed in a cleaning liquid.

The first object of the present invention is achieved by an apparatus for cleaning a solid surface, comprising a cleaning bath containing a cleaning liquid which is obtained by mixing insoluble particles in a liquid and means for bringing the cleaning liquid into an eddy-flow state.

In the above-described apparatus for cleaning a solid surface, the insoluble particles may be particles of at least one selected from the group consisting of glass, silicon, alumina, calcium carbonate and cerium oxide. The liquid may be at least one selected from the group consisting of pure or deionized, a detergent and an organic solvent. The means for bringing the cleaning liquid into an eddy-flow state may be a stirring apparatus. Alternatively, the means for bringing the cleaning liquid into an eddy-flow state may be a vibration generating apparatus.

In a preferred form of the apparatus for cleaning a solid surface, the apparatus may further comprise means for mixing air bubbles in the cleaning liquid.

The second object of the present invention is achieved by a method of cleaning a solid surface by bringing a cleaning liquid into contact with the solid surface to be cleaned, wherein the cleaning liquid is obtained by mixing insoluble particles in the liquid, and the liquid state thereof is changed to an eddy-flow state in a cleaning bath.

In the method of cleaning a solid surface, at least one selected from the group consisting of glass, silicon, alumina, calcium carbonate and cerium oxide may be used as a material for the insoluble particles.

Regarding the liquid, one selected from the group consisting of pure water, a detergent and an organic solvent may be used as the liquid. Preferably, the state of the cleaning liquid obtained by mixing the insoluble particles in the liquid may be changed to an eddy-flow state by mixing air bubble in the cleaning liquid. Alternatively, the state of the cleaning liquid obtained by mixing the insoluble particles in the liquid may be changed to an eddy-flow state by vibrating the closed cleaning bath containing a vapor phase and the cleaning liquid.

The third object of the present invention is achieved by an apparatus for cleaning a solid surface, comprising a cleaning bath containing a cleaning liquid which is obtained by mixing insoluble particles in a liquid, means for bringing the cleaning liquid into an eddy-flow state and means for heating the cleaning liquid.

The fourth object of the present invention is achieved by a method of cleaning a solid surface by bringing a cleaning liquid into contact with a solid surface to be cleaned, wherein a solid surface to be cleaned having solid fat or oil thereon is heated to a temperature near the softening point of the fat or oil, the cleaning liquid is obtained by mixing insoluble particles in a liquid, and the liquid state of the cleaning liquid is changed to an eddy-flow state in a cleaning bath, so that the softened fat or oil can be removed.

DESCRIPTION OF THE PREFERRED EMBODIMENTS

Figure 1:
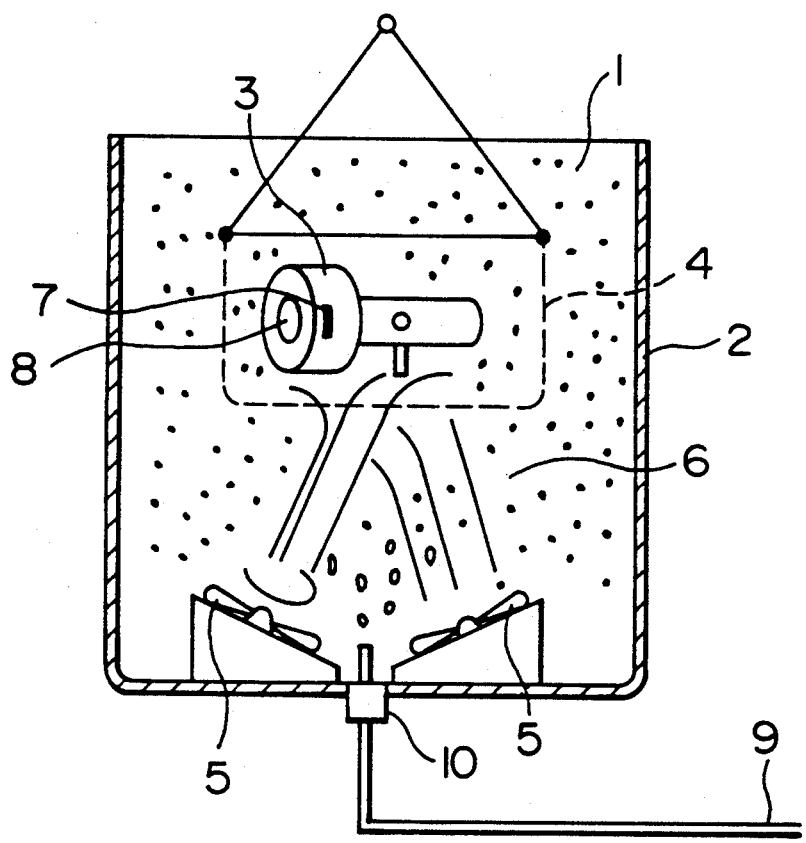
FIG. 1 is a schematic drawing of an apparatus of cleaning a solid surface in accordance with the present invention.

As a result of various experiments conducted by the inventors on an apparatus and method for cleaning a solid surface, the inventors obtained the following finding:

The first object of the present invention can be achieved by an apparatus for cleaning a solid surface, comprising a cleaning bath containing a cleaning liquid which is obtained by mixing insoluble particles in a liquid, and means for bringing the cleaning liquid into an eddy-flow state.

The second object of the present invention can be achieved by a method of cleaning a solid surface by bringing a cleaning liquid into contact with the solid surface to be cleaned, wherein the cleaning liquid is obtained by mixing insoluble particles in a liquid, and the state of the cleaning liquid is changed to an eddy-flow state in a cleaning bath.

Although glass, silicon, alumina, an organic resin, calcium carbonate, cerium oxide or the like is used as a material for the insoluble particles when a substance to be cleaned off is general dirt, for or the like, the insoluble particles are not limited thereto so long as they are insoluble. In addition, when a substance to be cleaned off is liquid or solid fat or oil, it is preferable to use calcium carbonate having the property of adsorbing such liquid or solid fat or oil. When a substance to be cleaned off is general dirt, fur or the like, pure water may be used as the liquid, and a detergent or an organic solvent may also be used for increasing the cleaning force. When a substance to be cleaned off is liquid or solid fat or oil, a detergent or an organic solvent is preferably used. The cleaning liquid contains the insoluble particles dispersed therein so that the insoluble particles are caused to collide with a board surface by virtue of the kinetic energy, thereby cleaning the surface. A predetermined number of collisions of the insoluble particles in the cleaning liquid causes cleaning of the surface. The use of a small amount of insoluble particles requires time considerable cleaning, while the use of a large amount of insoluble particles requires only a cleaning time. Thus, the composition of the cleaning fluid has no relation to the cleaning capability. A stirring apparatus, a vibration generating apparatus or the like is used as the means for providing an eddy flow in the cleaning liquid. In order to improve the effect of the means for forming an eddy flow in the cleaning liquid, the means for mixing bubbles in the cleaning liquid may be used in combination with the above means forming an eddy flow.

The third object of the present invention can be achieved by an apparatus for cleaning a solid surface, comprising a cleaning bath containing a cleaning liquid which is obtained by mixing insoluble particles in a liquid, means for bringing the cleaning liquid into an eddy-flow state and means for heating the cleaning liquid. This apparatus is the same as the apparatus for cleaning a solid surface which permits the achievement of the first object of the present invention, with the exception that the means for heating the cleaning liquid is provided therein. The means for heating the cleaning liquid is provided for heating the solid fat or oil adhering to the solid surface to be cleaned to a temperature near the softening point of the solid fat or oil, thereby easily removing the fat or oil.

The fourth object of the present invention can be achieved by a method of cleaning a solid surface by bringing a cleaning liquid into contact with a solid surface to be cleaned, wherein the solid surface having a solid fat or oil thereon is heated to a temperature near the softening point of the solid fat or oil, and the cleaning liquid is obtained by mixing insoluble particles in a liquid and is made to have an eddy-flow state in a cleaning bath so that the softened solid fat or oil can be removed. This method is the same as the method of cleaning a solid surface which permits the achievement of the second object of the present invention, with the exception that the solid surface having a solid fat or oil thereon is heated to a temperature near the softening point of the solid fat or oil so that the fat or oil can be removed.

The present invention is described below with reference to embodiments.

As shown in FIG. 1, an apparatus for cleaning a solid surface of the present invention includes a cleaning liquid 1, a cleaning bath 2, a part to be cleaned 3, a cage 4 in which the part 3 is placed, a stirring apparatus 5, fine particles 6, a contaminant 7, a hole of the part 3 to be cleaned, a gas supply 9, and a bubble generator 10.

In operation, the part 3 to be cleaned having a surface provided with a complicated shape is placed in the exclusive FIG. 4 which has a mesh structure or the like so as to prevent the cage 4 from interrupting the flow of the cleaning liquid 1, and the part 3 is immersed in the cleaning liquid 1 containing the fine particles 6 in the cleaning bath 2. The cleaning bath 2 is equipped with the stirring apparatus 5 such as a rolling fan for causing the cleaning liquid 1 to flow which can accurately cause a liquid current by rotation. The fine particles 6 contained in the cleaning liquid 1 are moved together with the liquid current, caused to collide with the surface of the part 3 by virtue of inertia so as to separate the contaminant 7 adhering to the surface of the part 3 and entrap the contaminant 7 in the cleaning liquid 1, thereby removing the contaminant 7. The stirring apparatus 5 functions to control the rotational speed, rotational direction and the angle with respect to the part 3 for converting the liquid flow into an eddy flow so as to cause a flow in the hole 8. The contaminant 7 in the hole 8 of the part 3 to be cleaned having a complicated structure is thus able to be removed by causing the particles 6 to collide with the entire internal surface of the hole 8, whereby the overall surface of the part 3 is cleaned. The cleaning apparatus may be provided with a gas supply 9 for supplying bubbles in the cleaning liquid 1 and a bubble generator 10 for generating fine bubbles of gas by employing ultrasonic waves, both of which are provided together with the stirring apparatus 5 or in place of the apparatus 5 so that the cleaning efficiency in the hole 8 can be further increased.

The above cleaning method mainly utilizes the liquid dynamic effect of the cleaning liquid.

Other considerable effects include the temperature effect of the cleaning liquid and the effect of characteristics of the fine particles in the cleaning liquid.

With regard to the temperature effect, for example, the efficiency of removal of the rosin wax fused on a glass board was increased by several times when the temperature of the cleaning liquid is increased to 60° to 80° C.

The type of the fine particles mixed in the cleaning liquid and the results of measurement of the mixing state, particle size, specific gravity, hardness and so on of the particles are described below.

The type of the particles, which is effective for cleaning, includes particles such as glass beads, silicon powder, calcium carbonate particles or the like, which were insoluble in the cleaning liquid.

A particle size of several μm to several mm is effective. The specific gravity of the particles may be a value which allows the particles to suspend in a liquid state (stirring function) (which or allow the particles to sediment in the liquid in a stationary state. Although the hardness of the particles had a relationship to the material of the part to be cleaned and the flow rate of the liquid, it is necessary to select a degree of hardness which causes no flaw on a surface.

Although the influences of the factors on an increase in the cleaning efficiency are related to each other and complicated, it is effective to use calcium carbonate particles when, a precision part such as a printed circuit board is cleaned by using as a cleaning liquid, pure water.

Pure water is preferably used as the cleaning liquid because of its easy handling, safety and low cost.

Figure 2:
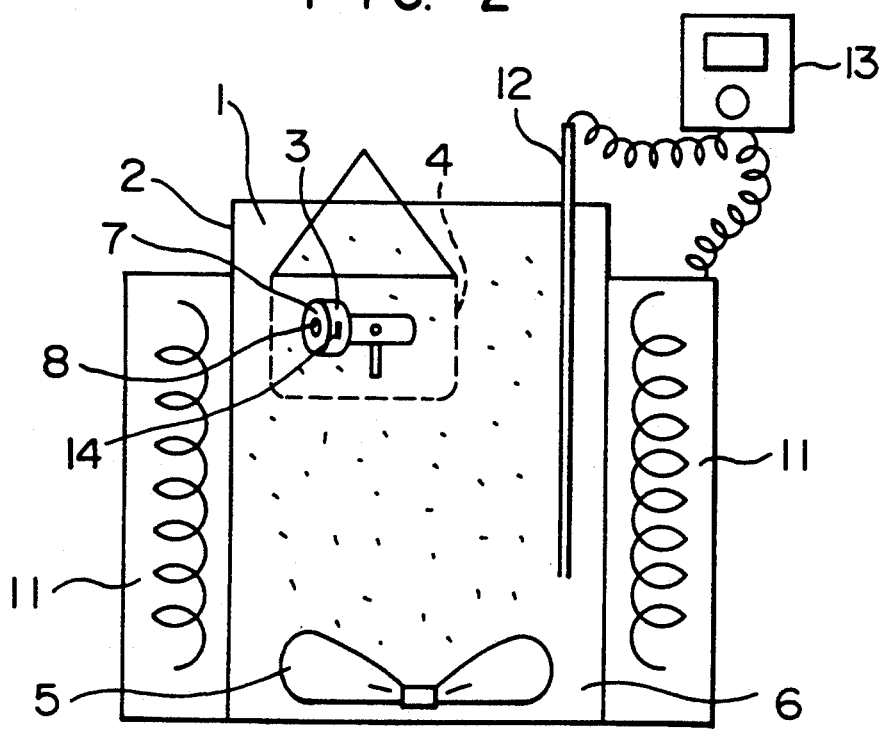
FIG. 2 is a schematic drawing of an apparatus of the present invention for cleaning a solid surface which apparatus is effective for solid fats and oils to be cleaned off.

In the embodiment of FIG. 2 a cleaning apparatus which is particularly effective to a substance to be cleaned off such as solid fat or oil includes a cleaning liquid; reference 1, a cleaning bath; reference 2, a part 3 to be cleaned, a jig 4 in which the part 3 is placed, a stirring apparatus 5, fine particles; reference 8, a hole 8 of the part 3 to be cleaned, a heating heater 11, a temperature measuring device 12, a temperature controller 13, a solid fat or oil contaminant 14.

In operation, the part 3 to be cleaned having a surface having a complicated shape is placed in the exclusive jig 4 which has a mesh structure or the like so as to prevent the jig 4 from interrupting the flow of the cleaning liquid 1, with the part 3 being immersed in the cleaning liquid 1 containing the fine particles 6 in the cleaning bath 2. The cleaning bath 2 is equipped with the stirring apparatus 5 such as a rolling fan which accurately caused a liquid current by rotation for causing the cleaning liquid 1 to flow. At the same time, the cleaning liquid 1 is heated to a desired temperature by the heating heater 11, with the temperature of the cleaning liquid 1 being measured by the temperature measuring device 12. The heating heater 11 was turned on and off by the temperature controller 13 which receives the measurement results from the temperature measuring device 12. The solid fat or oil contaminant 14 adhering to the part 3 to be cleaned is heated and softened by the cleaning liquid 1 heated by the heating heater 11. The fine particles 6 contained in the cleaning liquid 1 are moved together with the flow of the cleaning liquid 1 and caused to collide with a surface of the parts 3 by virtue of inertia so as to separate the softened solid fat or oil contaminant 14 adhering to the surface and entraps the contaminant 14 in the cleaning liquid 1, thereby removing the contaminant 14. The stirring apparatus 5 functions of control the rotational speed, rotational direction and the angle with respect to the part 3 for converting the liquid flow into an eddy flow so as to cause a flow in the hole 8. The contaminant 7 in the hole 8 of the part 3 to be cleaned having a complicated structure is thus able to be removed by causing the particles 6 to collide with the entire internal surface of the hole 8, whereby the overall surface of the part 3 can be cleaned.

Figure 3:
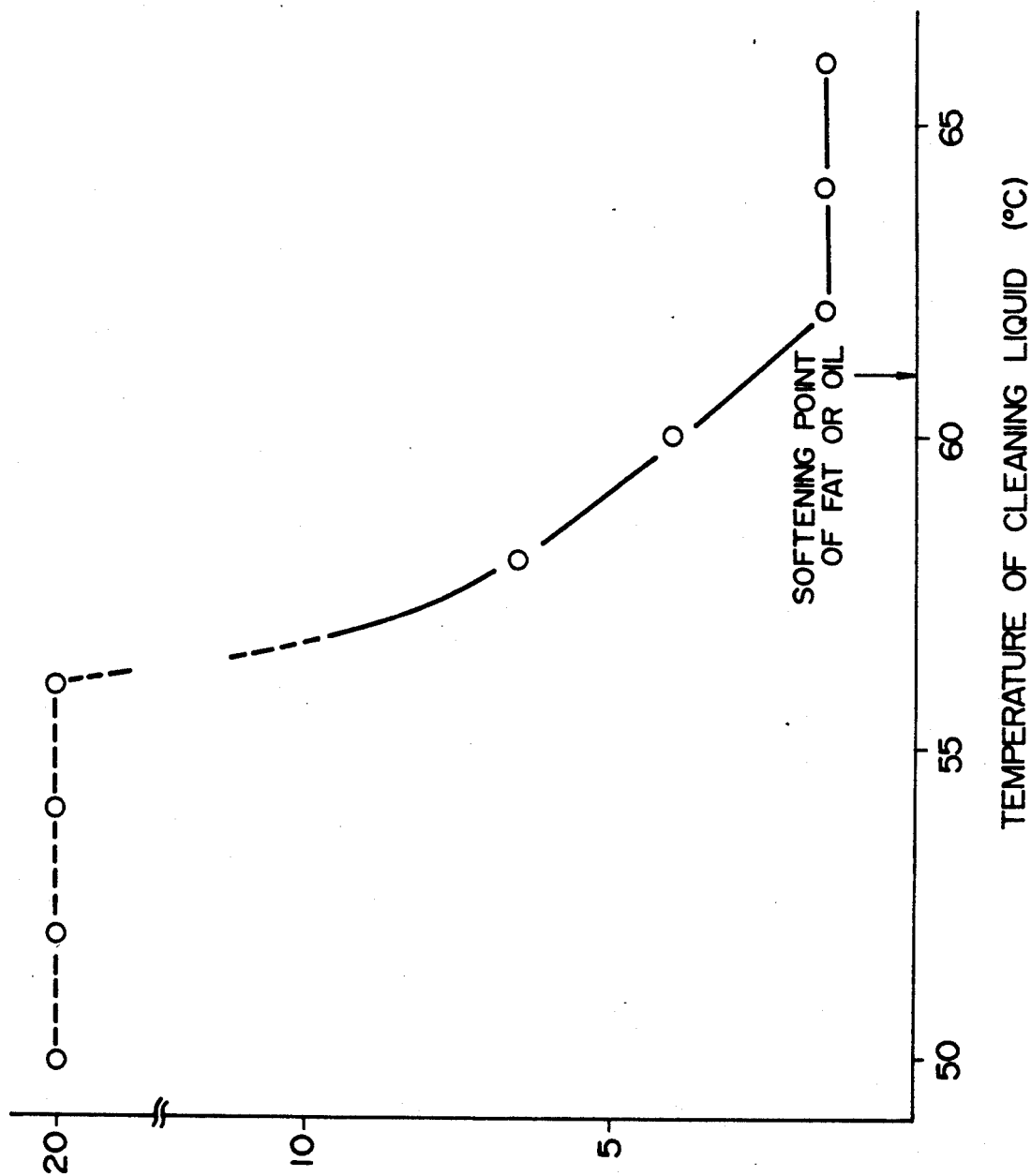
FIG. 3 is a graphic illustration of a relationship the cleaning temperature and the cleaning time when solid fat or oil is cleaned off by using an apparatus of the invention for cleaning a solid surface.

FIG. 3 graphically depicts a relationship between the temperature of the cleaning liquid and the cleaning time when solid fat or oil contaminant was cleaned off by the cleaning apparatus in accordance with the present invention. Stick wax was used as the solid fat or oil contaminant 14 (softening point of 61° C.) to be cleaned off. About 0.1 g of stick was coated on a glass plate to form a contaminant to be cleaned off. Glass beads of 1 mm in diameter were used as the insoluble particles, and pure water was used as the cleaning liquid. After the cleaning liquid containing the insoluble particles had been heated to a desired temperature, the glass plate with the stick wax was immersed in the cleaning liquid which was stirred at 1400 rpm together with the particles, and the time required for removing by cleaning was measured. However, the limit of the cleaning time was 20 minutes. As a result, it was found that the wax can be removed by cleaning off through the cleaning liquid at a temperature of 58° C. or more. The wax could not be removed by the cleaning liquid at a temperature of 56° C. or less for 20 minutes, without the cleaning effect. This reveals that a solid fat or oil can be removed by cleaning using the cleaning liquid heated to a temperature near the softening point of the solid fat or oil.

Table 1 shows the time required for removing each of the five types of wax including the stick wax, sky wax, hot wax, apiezon wax and hot melt, which were used as solid fat or oil, by cleaning using a cleaning liquid at two temperatures, a temperature below the softening point of the wax and a temperature above the softening point of the wax. In Table 1, mark x represents the cleaning result that the fat or oil could not be removed by cleaning for 20 minutes. It can be seen from Table 1 that any one of the wax types used can be removed by cleaning using the cleaning liquid at a temperature near the softening point of the wax for a time of about 1 minute. It can also be seen that much time is required for cleaning by using the cleaning liquid at a temperature below the softening point.

The present invention therefore enables the contaminant adhering to a surface of a substrate to be cleaned, which surface has a complicated shape and a structure with a hole, a recess or the like, to be easily and efficiently removed by cleaning.

The present invention also enables the contaminant adhering to a surface of a substance to be cleaned having a complicated shape and a structure with a hole, a recess or the like to be easily and efficiently removed by cleaning for a short time. Particularly, the present invention has the significant effect of cleaning off solid fats and oils without using CFC or a chlorocarbon-type organic solvent which has at present an environmental problem all over the world.

TABLE 1

| Wax Name | Effect of Removing Wax by Cleaning Using Eddy-Flow Fine Particles | | | | |
| --- | --- | --- | --- | --- | --- |
| | Softening Point | Liquid Temperature | Cleaning Time* | Cleaning Effect | Re-adhesion |
| Stick Wax | 61° C. | 47° C. | 20 min. | x | No |
| | | 61° C. | 1 min. and 10 sec. | o | No |

TABLE 1-continued

Effect of Removing Wax by Cleaning Using Eddy-Flow Fine Particles

| Wax Name | Softening Point | Liquid Temperature | Cleaning Time* | Cleaning Effect | Re-adhesion |
| --- | --- | --- | --- | --- | --- |
| Sky Wax | 76° C. | 63° C. | 20 min. | x | No |
|  |  | 75° C. | 45 sec. | o | No |
| Hot Wax | 86° C. | 73° C. | 4 min. and 30 sec. | o | No |
|  |  | 85° C. | 1 min. | o | No |
| Apiezon Wax | 85° C. | 70° C. | 2 min. and 30 sec. | o | No |
|  |  | 85° C. | 1 min. and 30 sec. | o | No |
| Hot Melt | 100° C. | 87° C. | 20 min. | o | No |

*Time required for removing wax
Cleaning liquid: pure water

What is claimed is:

1. A method for cleaning a solid surface containing solid fat or oil thereon by bringing a cleaning liquid into contact with said solid surface to be cleaned, the method comprising the steps of preparing a cleaning liquid of a mixture of pure water and insoluble calcium carbonate particles in a cleaning bath, heating the cleaning liquid up to a temperature near the softening point of the solid fat or oil, and causing an eddy-flow in the cleaning liquid in said cleaning bath so that the softened solid fat or oil is removed from said solid surface.

2. A method of cleaning a solid surface according to claim 1, wherein the step of causing the eddy-flow of the cleaning liquid includes stirring by a stirring apparatus.

3. A method of cleaning a solid surface according to claim 1, wherein the step of causing the eddy-flow of the cleaning liquid includes mixing bubbles in said cleaning liquid.

4. A method of cleaning a solid surface according to claim 1, wherein the step of causing the eddy-flow in the cleaning liquid includes introducing bubbles into said cleaning liquid, closing the cleaning bath with both the bubbles and cleaning liquid therein, mechanically vibrating the cleaning bath.

* * * * *